United States Patent
Baker

(10) Patent No.: US 6,667,561 B2
(45) Date of Patent: Dec. 23, 2003

(54) INTEGRATED CIRCUIT CAPABLE OF OPERATING IN MULTIPLE ORIENTATIONS

(75) Inventor: David Stuart Baker, Girton (GB)

(73) Assignee: GlobespanVirata, Incorporated, Red Bank, NJ (US)

(*) Notice: Subject to any disclaimer, the term of this patent is extended or adjusted under 35 U.S.C. 154(b) by 0 days.

(21) Appl. No.: 10/063,036

(22) Filed: Mar. 13, 2002

(65) Prior Publication Data
US 2003/0176013 A1 Sep. 18, 2003

(51) Int. Cl.$^7$ ................................................ H01L 23/48
(52) U.S. Cl. .................. 257/786; 257/780; 257/778; 257/697; 257/738; 361/777; 324/765
(58) Field of Search ................ 257/697, 735, 257/737, 738, 778, 780, 786; 361/777, 783; 324/765

(56) References Cited

U.S. PATENT DOCUMENTS

| 5,126,822 A | | 6/1992 | Salters et al. | |
|---|---|---|---|---|
| 5,588,861 A | | 12/1996 | Townsend | |
| 5,672,981 A | * | 9/1997 | Fehrman | 324/760 |
| 5,859,538 A | * | 1/1999 | Self | 324/755 |
| 5,880,590 A | * | 3/1999 | Desai et al. | 324/757 |
| 6,149,449 A | | 11/2000 | Abe | |
| 6,345,999 B1 | * | 2/2002 | Okuyama et al. | 439/268 |
| 6,347,946 B1 | | 2/2002 | Trobough et al. | |
| 6,371,782 B1 | * | 4/2002 | Ohashi | 439/266 |

* cited by examiner

Primary Examiner—Kamand Cuneo
Assistant Examiner—Lourdes Cruz
(74) Attorney, Agent, or Firm—Hunton & Williams LLP

(57) ABSTRACT

An integrated circuit design is provided capable of operating in multiple insertion orientations. In particular, the inventive circuit design includes an integrated circuit package having a plurality of contact elements extending from the integrated circuit package and arranged symmetrically thereon for enabling the integrated circuit to be inserted on a circuit board in at least two discrete orientations. A plurality of the contact elements are designated as orientation pins, the orientation pins being arranged such that, upon integrated circuit package power up, the orientation pins transmit orientation signals indicative of the integrated circuit packages insertion orientation in the circuit board. A plurality of multiplexer devices are provided for routing signals between the contact elements and integrated circuit functional circuitry in response to the orientation signals from the orientation pins.

15 Claims, 2 Drawing Sheets

INTEGRATED CIRCUIT CAPABLE OF OPERATING IN MULTIPLE ORIENTATIONS

BACKGROUND OF THE INVENTION

The present invention relates generally to integrated circuits and in particular, to an integrated circuit design for facilitating insertion of the circuit into a circuit board.

Conventional integrated circuit packages (IC's) include a plurality of contact elements, such as pins or balls which extend from a lower surface of the IC. These pins are arranged in a pattern which corresponds to a pattern of receiving cavities on a printed circuit board into which the IC is to be inserted. As is understood in the art, these pins conventionally extend from the lower surface of the IC and are electrically connected to at least one silicon chip attached to the upper surface of the IC.

The design of conventional IC's require the IC to be inserted into the PCB in a specific orientation, thereby ensuring that the proper pins depending from the IC are inserted into appropriate cavities on the PCB. Because improper insertion of the IC into a PCB correspondingly results in the improper operation of the electronic device or damage to the device itself, conventional design requires steps to ensure that such improper insertion does not occur. Known steps to ensure such proper insertion typically include additional quality control measures, (e.g., additional review by installers), and additional mechanical means present on the IC's or PCB's for preventing the improper insertion of the IC, (e.g. keying of the IC's). Each of these alternatives introduce additional expense into the production cost of the completed circuit board.

Accordingly, there is a need in the art of integrated circuits for an integrated circuit package design which substantially reduces the cost of producing printed circuit boards by removing the requirement that the integrated circuit be inserted within the board in a predetermined orientation.

SUMMARY OF THE INVENTION

The present invention overcomes the problems noted above, and provides additional advantages, by providing an integrated circuit package capable of operating in multiple orientations. In particular, the inventive circuit design includes an integrated circuit package having a plurality of contact elements or pins extending from the integrated circuit package and arranged symmetrically thereon for enabling the integrated circuit to be inserted on a circuit board in at least two discrete orientations. A plurality of the contact elements are designated as orientation pins, the orientation pins being arranged such that, upon integrated circuit package power up, the orientation pins transmit orientation signals indicative of the integrated circuit packages insertion orientation in the circuit board. A plurality of multiplexer devices are provided for routing signals between the contact elements and integrated circuit functional circuitry in response to the orientation signals from the orientation pins.

The integrated circuit package of the present invention enables the device to be inserted into a circuit board in any orientation. This reduces board production cost by eliminating the requirement to ensure correct device orientation prior to insertion into the circuit board.

BRIEF DESCRIPTION OF THE DRAWINGS

The present invention can be understood more completely by reading the following Detailed Description of Preferred Embodiments, in conjunction with the accompanying drawings, in which.

DETAILED DESCRIPTION OF THE DRAWINGS

Figure 1:
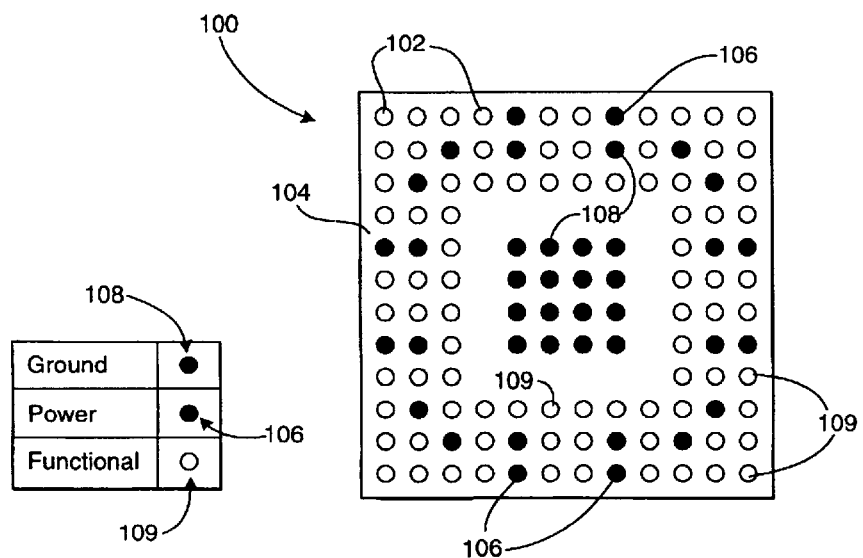
FIG. 1 schematic diagram depicting one embodiment of an integrated circuit package designed in accordance with the present invention.

Referring to the Figures and, in particular, to FIG. 1, there is shown a schematic diagram depicting one embodiment of an integrated circuit package (IC) 100 designed in accordance with the present invention. In particular, IC 100 includes a plurality of contact elements, such as balls or pins 102 (hereinafter pins) arranged in a pattern and extending from a lower surface 104 of the IC package 100. Examples of suitable types of IC packages for use with the present invention include ball grid array (BGA) type IC packages as well as pin grid array (PGA) type IC packages or the like. As is understood in the art, pins 102 are conventionally connected to respective bonding pads which are then electrically connected to at least one silicon chip or other functional circuitry attached to intermediate or upper surfaces (not shown) of the IC 100. In operation, the pins 102 which depend from the IC 100 are inserted into or otherwise operationally connected to a corresponding plurality of receiving cavities on a printed circuit board (PCB) (also not shown).

Several of the pins 102 of IC 100 are designated as power supply pins 106. These pins are responsible for receiving power for the IC 100 from power supply associated with the PCB. Additionally, several pins 108 are designated as ground pins for connecting the device to group. In accordance with the present invention, the power supply pins 106 and the ground pins 108 are provided in a symmetrical configuration, such as that depicted in FIG. 1. The remainder of the pins 102 are functional pins 109 which perform different functions depending upon the orientation of the IC. By providing such a symmetrical configuration, power delivery is ensured to the IC 100 regardless of its orientation within the PCB. In the example of FIG. 1, four possible insertion orientations are provided, however, it should be understood that the present invention is not limited to this number of insertion orientations. Rather, the present invention may be utilized in any IC package having at least two possible insertion orientations.

Figure 2:
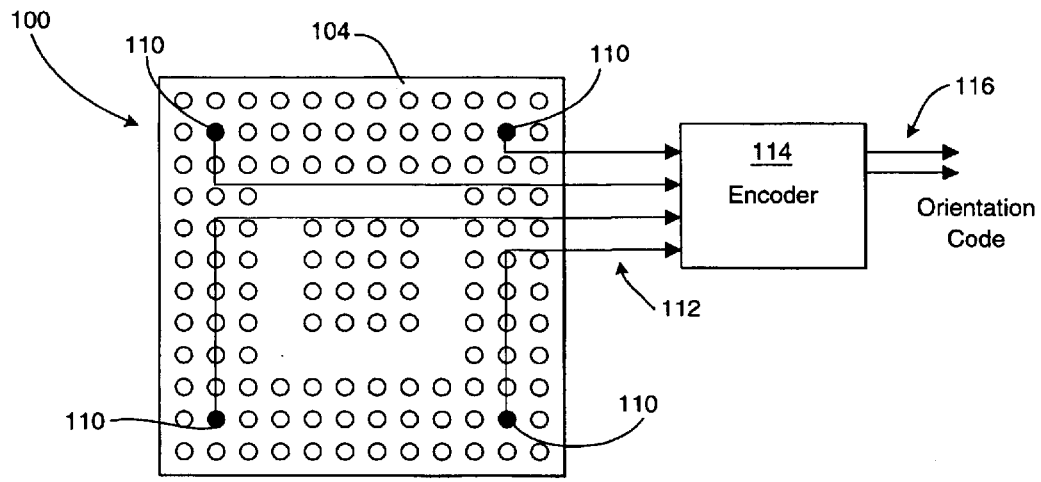
FIG. 2 is a second schematic diagram of the integrated circuit package of FIG. 1 depicting one manner in which IC orientation is determined.

Merely ensuring that power is delivered to the IC does not ensure that the device will operate properly in all possible orientations. Accordingly, the IC 100 also includes elements which enable it to determine, upon device power up, the orientation into which it has been inserted into the PCB. Once the orientation has been identified, the IC modifies the operation of each functional pin (if necessary) to correspond to the identified orientation. Referring now to FIG. 2, there is shown a second schematic diagram of IC 100 depicting one manner in which the IC insertion orientation is determined. In particular, several pins are designated as orientation pins 110. In the embodiment of FIG. 2, four orientation pins 110 have been provided. In a preferred embodiment, regardless of orientation, the four orientation pins are selected such that three of the orientation pins 110 are pulled to a high logical voltage by the circuit board while the fourth is pulled to a low logical voltage by the circuit board. In this manner, the relative location of the low logical voltage pin is representative of the IC's orientation.

Upon IC power up, the relative voltages at the four orientation pins 110 result in orientation signals 112 being sent to an encoder device 114 electrically connected to the orientation pins 110. As is understood in the art, an encoder is a class of electronic device in which a set of $2^n$ input signals results in n output signals combining to form an n bit output code. In the present embodiment, the encoder device 114 is a four to two (4:2) encoder device wherein the four input signals 112 result in the output of two signals which combine to form a 2 bit orientation code 116 based upon which of the pins 110 is pulled low by the circuit board. Accordingly, this code is indicative of the orientation of the IC relative to the PCB. In a preferred embodiment of the present invention, the orientation pins 110 only provide the orientation signal immediately upon power up and may revert to convention functional operation following such transmission. In this manner, pins 110 do not need to be dedicated to orientation and may be fully utilized during the conventional operation of the device. One exemplary embodiment of orientation code values may be represented by the following table.

| Orientation Pin 1 | Orientation Pin 2 | Orientation Pin 3 | Orientation Pin 4 | Orientation Code 1 | Orientation Code 2 |
| --- | --- | --- | --- | --- | --- |
| High | High | High | Low | High | High |
| High | High | Low | High | High | Low |
| High | Low | High | High | Low | High |
| Low | High | High | High | Low | Low |

Once the orientation of the IC 100 relative to the PCB has been determined, each pin must be routed to the location on the IC's functional circuitry. Since four distinct orientations are enabled, each pin 102 must be enabled to transmit signals to any of four potential destinations, one relating to each of the four orientations. Correspondingly, output signals from the functional circuitry must also be routed to the appropriate pins 102 for relay to the PCB.

Figure 3:
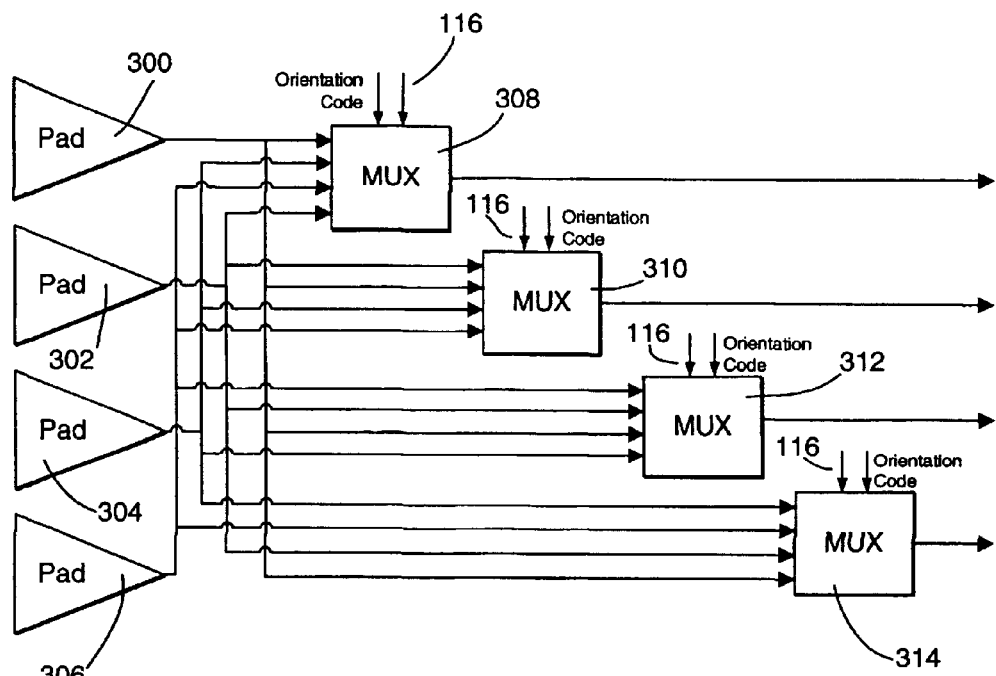
FIG. 3 is a schematic circuit diagram depicting one embodiment of device for enabling the relay of input pads having multiple possible orientations to functional circuitry.

Referring now to FIG. 3, there is shown a schematic circuit diagram depicting one embodiment of device for enabling the above-described operation. In particular, pads 300, 302, 304 and 306 relate to exemplary connections between any four functional pins 102 which share a common relative position in the pin layout depending upon the orientation of the IC in the PCB. Because each of these four pads relate specifically to different functions depending upon orientation, the task at hand is routing the proper pad connection to its proper function in the associated circuitry.

To accomplish this task, four discrete multiplexer (MUX) devices 308, 310, 312 and 314 are used to receive signals from each pad 300–306 as well the two bit orientation code 116 defined above. The MUX's then operate to selectively pass through the appropriate signals to the functional IC circuitry in the IC. As is known in the art, MUX's conventionally operate to receive 2 input lines and, using n selection lines, output one resulting output signal which is the logical sum of the product of the input lines and the selection lines. In the present embodiment, the MUX devices are four to one (4:1) multiplexers wherein the selection lines are the two orientation code lines 116 and the input lines are the 2, or 4 signal lines from pads 300–306, respectively. Depending upon the value of the orientation code 116, a single signal line is output from each MUX 308. One exemplary embodiment of the operation of MUX 308 in each of the four orientations may be represented by the following table.

| Input 1 | Input 2 | Input 3 | Input 4 | Orient. Code 1 | Orient Code 2 | Output |
| --- | --- | --- | --- | --- | --- | --- |
| Pad 300 | Pad 304 | Pad 306 | Pad 302 | Low | Low | Pad 300 |
| Pad 300 | Pad 304 | Pad 306 | Pad 302 | Low | High | Pad 304 |
| Pad 300 | Pad 304 | Pad 306 | Pad 302 | High | Low | Pad 306 |
| Pad 300 | Pad 304 | Pad 306 | Pad 302 | High | High | Pad 302 |

Figure 4:
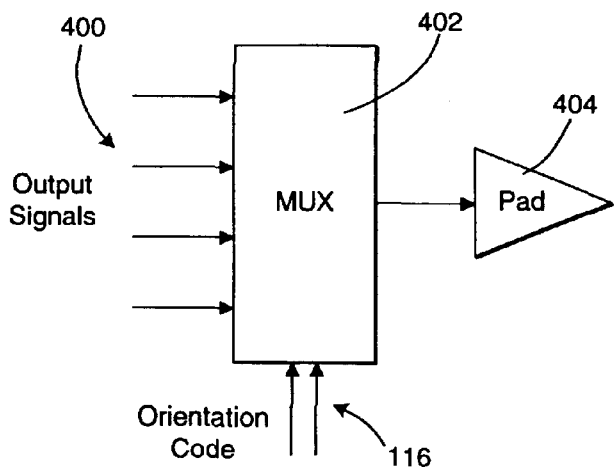
FIG. 4 is a schematic circuit diagram depicting one embodiment of device for enabling the output of signals from function circuitry to pads having multiple possible orientations.

Just as input signals must be routed to appropriate destinations within the IC functional circuitry, output signals must also be routed to appropriate pads for relay through pins 102 to the PCB. Referring now to FIG. 4, there is shown a schematic circuit diagram illustrating one embodiment of a device for accomplishing this task. In particular, a set of four output signals 400 are associated with each output pad 404, each output signal being associated with the output of one of four potential functions within the IC circuitry. As with the input signals described above, by using the bit values of the orientation code 116, a MUX 402 is able to pass through the appropriate output signal to the proper pad 404. In this manner, output pads receive only those output signals destined for relay to the PCB.

By providing a cost effect IC design which eliminates the need for specific insertion orientation of IC devices, the present invention substantially reduces the cost and manufacturing overhead of conventional IC insertion techniques. While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. An integrated circuit package capable of operating in multiple orientations,
   a plurality of contact elements extending from a lower surface of the integrated circuit package, wherein the contact elements are arranged symmetrically thereon for enabling the integrated circuit package to be inserted on a circuit board in at least two discrete orientations;
   the plurality of contact elements including at least two orientation contact elements arranged such that, upon integrated circuit package power up, the orientation contact elements transmit orientation signals indicative of the integrated circuit packages insertion orientation in the circuit board; and
   functional circuitry integrated with the integrated circuit package, wherein the functional circuitry is operatively connected to the contact elements such that signals are routed between the contact elements and functional circuitry in response to the orientation signals from the orientation contact elements.

2. The integrated circuit package of claim 1, wherein the orientation signals are based upon circuit board voltage levels during power up of the integrated circuit package.

3. The integrated circuit package of claim 1, further comprising:
a plurality of power supply contact elements for transmitting power to the integrated circuit package from the circuit board, wherein the power supply contact elements are arranged symmetrically on the integrated circuit package for enabling power transmission upon integrated circuit package insertion in any of the at least two discrete orientations.

4. The integrated circuit package of claim 3, further comprising:
a plurality of ground contact elements for providing a ground connection to the integrated circuit package, wherein the ground contact elements are arranged symmetrically on the integrated circuit package for enabling power transmission upon integrated circuit package insertion in any of the at least two discrete orientations.

5. The integrated circuit package of claim 1, further comprising:
an encoder device for receiving the orientation signals from the orientation contact elements and generating at least one orientation code signal representative of the orientation of the integrated circuit package within the circuit board,
wherein signals are routed between the contact elements and functional circuitry in response to the at least one orientation code signal from the encoder device.

6. The integrated circuit package of claim 5, wherein the at least two discrete orientations comprise four discrete orientations, wherein each contact element may be inserted into exactly four discrete locations in the circuit board and wherein each circuit board location may have exactly four contact elements inserted therein.

7. The integrated circuit package of claim 6, further comprising:
four orientation contact elements for transmitting four orientation signals representative of the integrated circuit insertion orientation; and
the encoder device comprising a four to two encoder device for generating two orientation code signals in response to four orientation signals.

8. The integrated circuit package of claim 1, further comprising:
a plurality of multiplexer devices operatively connected to the contact elements and the functional circuitry, wherein the multiplexer devices route signals between the contact elements and the functional circuitry in response to the orientation signals from the orientation contact elements.

9. The integrated circuit package of claim 7, further comprising:
a plurality of multiplexer devices operatively connected to the contact elements and the functional circuitry, wherein the multiplexer devices route signals between the contact elements and the functional circuitry in response to the orientation signals from the orientation contact elements.

10. The integrated circuit package of claim 9, wherein the plurality of multiplexer devices further comprise:
a plurality of four to one multiplexer devices for generating an output signal corresponding to one of the four contact elements capable of being inserted into the same location in the circuit board based upon the two orientation code signals from the four to two encoder device indicative of the integrated circuit insertion orientation in the circuit board.

11. The integrated circuit package of claim 9, wherein the plurality of multiplexer devices further comprise:
a plurality of four to one multiplexer devices for generating an output signal corresponding to one of the four locations in the circuit board capable of receiving a signal from the same contact element based upon the two orientation code signals from the four to two encoder device indicative of the integrated circuit insertion orientation in the circuit board.

12. The integrated circuit package of claim 7, wherein the four orientation signals are based upon circuit board voltage levels during power up of the integrated circuit.

13. The integrated circuit package of claim 12, wherein three orientation signals are pulled high from the circuit board and one orientation signal is pulled low from the circuit board.

14. The integrated circuit package of claim 1, wherein the integrated circuit package is a ball grid array type integrated circuit package wherein the contact elements comprise balls.

15. The integrated circuit package of claim 1, wherein the integrated circuit package is a pin grid array type integrated circuit package wherein the contact elements comprise pins.

* * * * *